United States Patent [19]

Garth

[11] 3,812,402

[45] May 21, 1974

[54] HIGH DENSITY DIGITAL SYSTEMS AND THEIR METHOD OF FABRICATION WITH LIQUID COOLING FOR SEMI-CONDUCTOR CIRCUIT CHIPS

[75] Inventor: Emory C. Garth, Austin, Tex.

[73] Assignee: Texas Instruments Incorporated, Dallas, Tex.

[22] Filed: Dec. 18, 1972

[21] Appl. No.: 316,203

[52] U.S. Cl..... 317/100, 317/101 DH, 317/101 CE, 339/17 CF, 174/15 R

[51] Int. Cl. .............................................. H05k 7/20

[58] Field of Search......... 317/100, 101 D, 101 DH, 317/101 CE, 101 CM, 101 CC; 165/105; 339/17 CF, 17 LM, 17 M, 18 C; 174/15 R

[56] References Cited

UNITED STATES PATENTS

| | | | |
|---|---|---|---|
| 3,417,814 | 12/1968 | Oktay | 317/100 |
| 3,725,744 | 4/1973 | Reed | 317/101 CE |
| 3,651,432 | 3/1972 | Henschen | 317/101 DH |
| 3,529,213 | 9/1970 | Farrand | 317/101 D |

FOREIGN PATENTS OR APPLICATIONS

| | | | |
|---|---|---|---|
| 406,350 | 8/1966 | Switzerland | 317/101 CE |

OTHER PUBLICATIONS

IBM Tech. Discl. Bull. Vol. 13, No. 9, Feb., 71, Latchable Contact Card-to-Board Connector, Brearley, Hogan, Pittwood, p. 2590.

*Primary Examiner*—Robert K. Schaefer
*Assistant Examiner*—Gerald P. Tolin
*Attorney, Agent, or Firm*—Harold Levine; Rene' E. Grossman; Stephen S. Sadacca

[57] ABSTRACT

High density interconnection and packaging is provided for complex digital systems such as computer systems in which unpackaged integrated logic and arithmetic elements are mounted in high density directly on logic cards. The logic cards are stacked in high density on multi-layer interconnection boards providing interconnection between the logic cards and providing the necessary operating power. One or more of the multi-layer interconnection boards having the logic cards mounted thereon are then packaged in a liquid cooling system.

25 Claims, 8 Drawing Figures

PATENTED MAY 21 1974

3,812,402

SHEET 4 OF 6

HIGH DENSITY DIGITAL SYSTEMS AND THEIR METHOD OF FABRICATION WITH LIQUID COOLING FOR SEMI-CONDUCTOR CIRCUIT CHIPS

This invention relates to complex digital systems and more particularly to the interconnection and packaging of such systems.

In designing complex digital systems such as large digital computer systems, performance, speed and size are major considerations. At present, most advanced systems of this type employ packaged semiconductor integrated circuits. The area required for the packages themselves limit the density of integrated circuits within the system. Also, the integrated circuits generate heat which is exchanged by forced air cooling. The amount of heat exchange required per integrated circuit also limits the integrated circuit density in the system. In accordance with the present invention, a total high density system interconnection packaging arrangement is provided for next generation digital systems. The interconnection and packaging arrangement is capable of providing a five-fold or greater improvement in system performance, speed and reduction in size in comparison to systems presently being utilized. The system also provides reliability, ease of fabrication and repair.

It is therefore an object of the present invention to provide complex digital systems having higher density of digital circuit elements per unit size than henceforth known in the art.

It is another object of the invention to provide complex digital systems having interconnection arrangements which eliminate transmission line effects and provide for higher speed of operation than henceforth known in the art.

A further object of the invention is to provide complex digital systems with improved performance and greater reliability.

These and other objects are accomplished in accordance with the present invention by providing a high density interconnection and packaging arrangement for complex digital systems in which unpackaged semiconductor integrated logic and arithmetic elements are mounted in high density directly on logic cards. The integrated circuit elements are connected to interconnections on the logic cards by, for example, beam leads. The logic cards are then stacked in high density on multi-layer interconnection boards providing interconnections between the logic cards and providing the necessary operating power for the integated circuit elements on the logic cards. One or more of the multi-layer interconnection boards having the logic cards mounted thereon are then packaged in a liquid cooling system.

The use of the unpackaged semiconductor integrated circuit elements provides higher circuit density per unit size of logic cards. Also, the close spacing of logic elements on the logic cards and the close spacing of logic cards on the multi-layer interconnection boards effectively eliminates the transmission line effect encountered in normal interconnection systems and therefore increases the speed of operation. The unpackaged integrated circuits placed in the liquid cooling system provides sufficient cooling for the inceased heat generated by the higher density of integrated circuits. The liquid cooling system also maintains a more constant temperature therefore providing greater reliability and performance characteristics. The use of the unpackaged integrated circuits and the beam leads also provide greater ease in fabrication and repair, particularly with respect to the manufacturer of the integrated circuits.

Still further advantages of the invention will be apparent from the detailed description and claims and from the drawings wherein;

Figure 1:
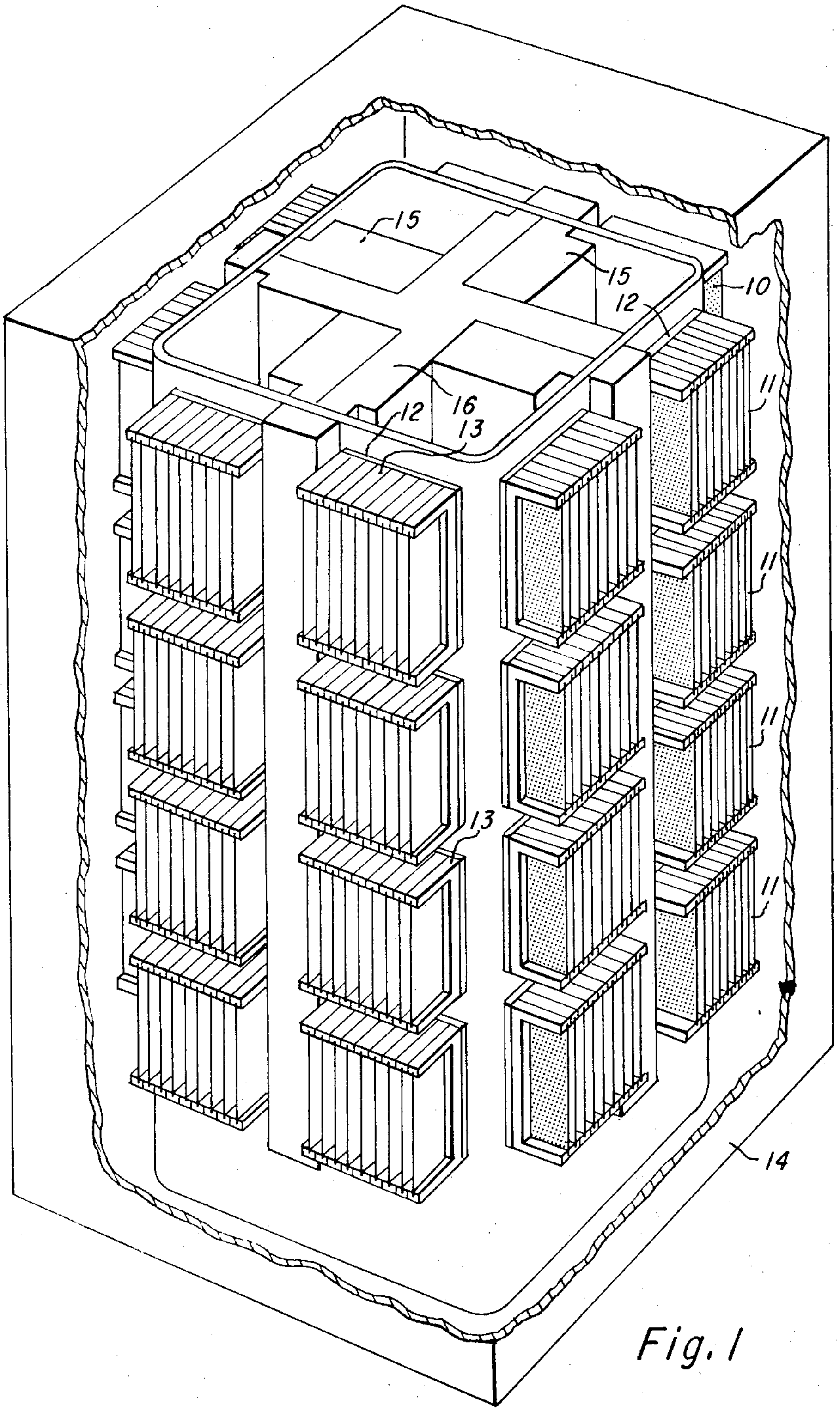
FIG. 1 is an isometric drawing of an embodiment of a high density digital system in accordance with the invention.

Referring now to FIG. 1, a high density digital system interconnected and packaged in accordance with the present invention is illustrated. Closely spaced unpackaged semiconductor integrated logic and arithmetic elements or chips 10 are mounted directly on logic cards 11. The logic cards 11 are then stacked in high density on multi-layer interconnection boards 12 which provide interconnections between the logic cards and the necessary operating power for the integrated circuit elements. The multi-layer interconnection board provides a back panel and the logic cards plug into connector sockets 13 to gain modularity and ease of maintenance and fabrication. In most instances, only a single multi-layer interconnection board 12 is required per major system sub-unit such as a memory unit, memory control unit, central processor unit, etc. One or more of the multi-layer interconnection boards having the logic cards mounted thereon are then packaged in a liquid cooling system 14. In the illustrated embodiment, 32 sub-units are shown mounted around the outer perimeter of a hollow rectangular solid. Voltage and ground bus bars 15 and 16, respectively, extend through the hollow portion of the rectangular solid to provide the necessary power to the multi-layer interconnection board and logic cards.

The remaining level of communication between sub-units is provided by a controlled impedance flexible connector which connects the major sub-units to complete the system.

The physical placement of each major logic function relative to each other within a sub-unit is provided to effect the most optimum interconnection paths for the sub-unit. In one embodiment placement of components on the semiconductor chips, placement of the chips on the logic cards and the positioning of the logic cards on the interconnection boards is optimized in terms of minimizing interconnection path lengths. This may be accomplished, for example, according to the teachings of U.S. Pat. Nos. 3,653,072, 3,653,071, 3,702,004 and 3,683,416 assigned to the assignee of the present invention.

Figure 2:
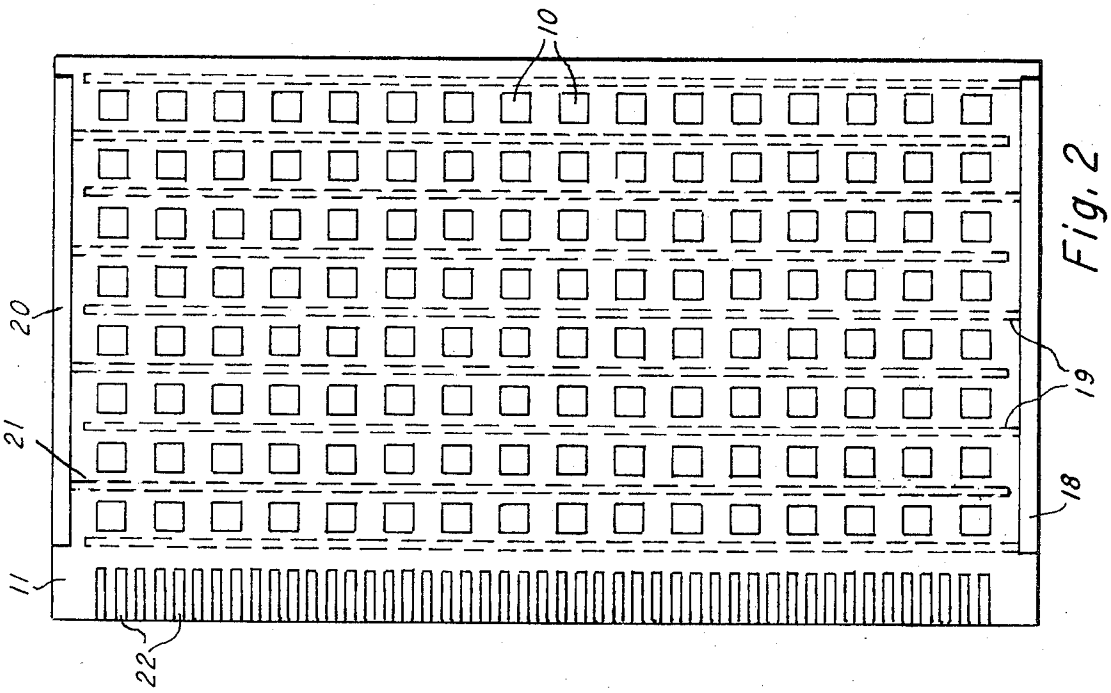
FIG. 2 is a planar view of a logic card showing the unpackaged integrated circuits mounted thereon and the conductors of the voltage-ground plane.

The logic card 11 having mounted thereon the unpackaged semiconductor integrated circuit chips 10 is illustrated in FIG. 2. The logic cards are, for example, 3.5 inches long by 1.8 inches wide and have a thickness of 100 mils. The semiconductor integrated circuit chips are, for example, 100 mils square and are mounted directly on a first major surface of the logic card 11. The logic card also includes a voltage edge connector 18 and a ground edge connector 20. The logic card includes two or more interconnection planes. One interconnection plane, illustrated in FIG. 2, includes conductors 19 extending from the voltage edge connector 18 and conductors 21 extending from ground edge connector 20 to provide the necessary operating voltage levels to the semiconductor chips 10.

The logic card 11 upon which the semiconductor integrated circuit chips 10 are mounted is, for example, comprised of a ceramic material. The number of semiconductor integrated circuit chips shown in the illustration of FIG. 2 is only representation of the number of chips on a logic card, the number being limited in each case by the size of the chips and the complexity of interconnections necessary for the particular circuit.

Also shown in FIG. 2 are the input/output edge connectors 22 which are, for example, 15 mils wide on 25 mil centers providing 10 mil spacing between conductors. It should be noted, that in further embodiments of the invention the semiconductor integrated circuit chips 10 may be mounted on both major surfaces of the logic card with additional interconnection planes sandwiched within the multi-layer circuit board comprising the logic card.

A typical embodiment of the invention having the integrated circuit chips 10 mounted on a single major surface of the logic card 11 includes three levels of interconnections: one level being the voltage-ground plane illustrated in FIG. 2, a second level providing interconnections mainly in the *x* or horizontal direction and the third level providing interconnections mainly in the *y* or vertical direction. A more detailed view of the integrated circuit chips and a typical interconnection pattern forming the second and third interconnection planes of an embodiment of the invention is illustrated in FIG. 3.

Figure 3:
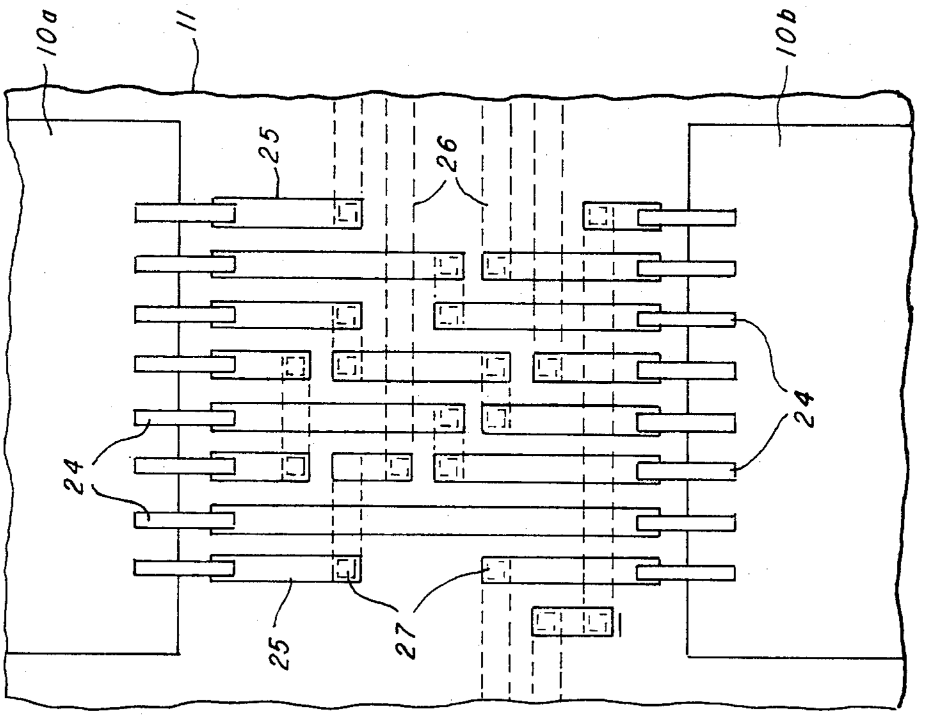
FIG. 3 is a planar view of the logic card showing in further detail the integrated circuit chips, the multi-layer interconnections and feedthrough conductors.

Referring then to FIG. 3, two of the integrated circuit chips 10 are shown mounted on a portion of the logic card 11. The interconnections to the terminals of the integrated circuit chip 10 are provided, for example, by beam leads, reflow solder techniques, or pressure bonding. Where pressure bonding is utilized, a piece of flexible polyimide film having an interconnection pattern formed thereon may be mounted intermediate to the chip terminals and the interconnection pattern on the logic card. The chip terminals would then be pressure bonded to the film pattern and the film pattern bonded to the interconnection pattern on the logic card. This may be accomplished according to the bonding technique of Bylander, U.S. Pat application Ser. No. 147,577 filed May 27, 1971 and assigned to the assignee of the present invention. The use of the intermediate polyimide film facilitates in the fabrication of the system and the removal of the chips from the logic card when replacement is required.

In the embodiment of FIG. 3 beam leads 24 provide connections from the integrated circuit chips 10*a* and 10*b* to the interconnection pattern on the logic card. The surface interconnection pattern 25 represented by the unbroken lines represents interconnections primarily in the horizontal direction while the subsurface or bottom surface interconnections 26 (as the case may be) represented by the broken lines represents interconnections primarily in the vertical direction. The physical size of the interconnections is limited relative to circuit speed in order to ensure a non-transmission line environment. The interconnections are, for example, 4½ wide on 8 mil centers providing 3½mil spacing between interconnections. The feedthrough conductors 27 are, for example, 4 mils square on 8 mil centers.

Because the unpackaged semiconductor logic elements 10 are mounted on the logic cards in such high density, the need for closely controlled transmission line interconnections is eliminated and yield and higher speed circuits are provided. An in-place circuit speed of 500 picofarads may be attained utilizing the present invention with interconnection delays held to less than 25 percent of the total delay. The primary contributors to in-place circuit speed are circuit propagation delays, circuit speed deteriorating due to loading and interconnection propagation delay. Propagation delay is essentially eliminated therefore reducing the need for the closely controlled transmission lines.

Figure 4A:
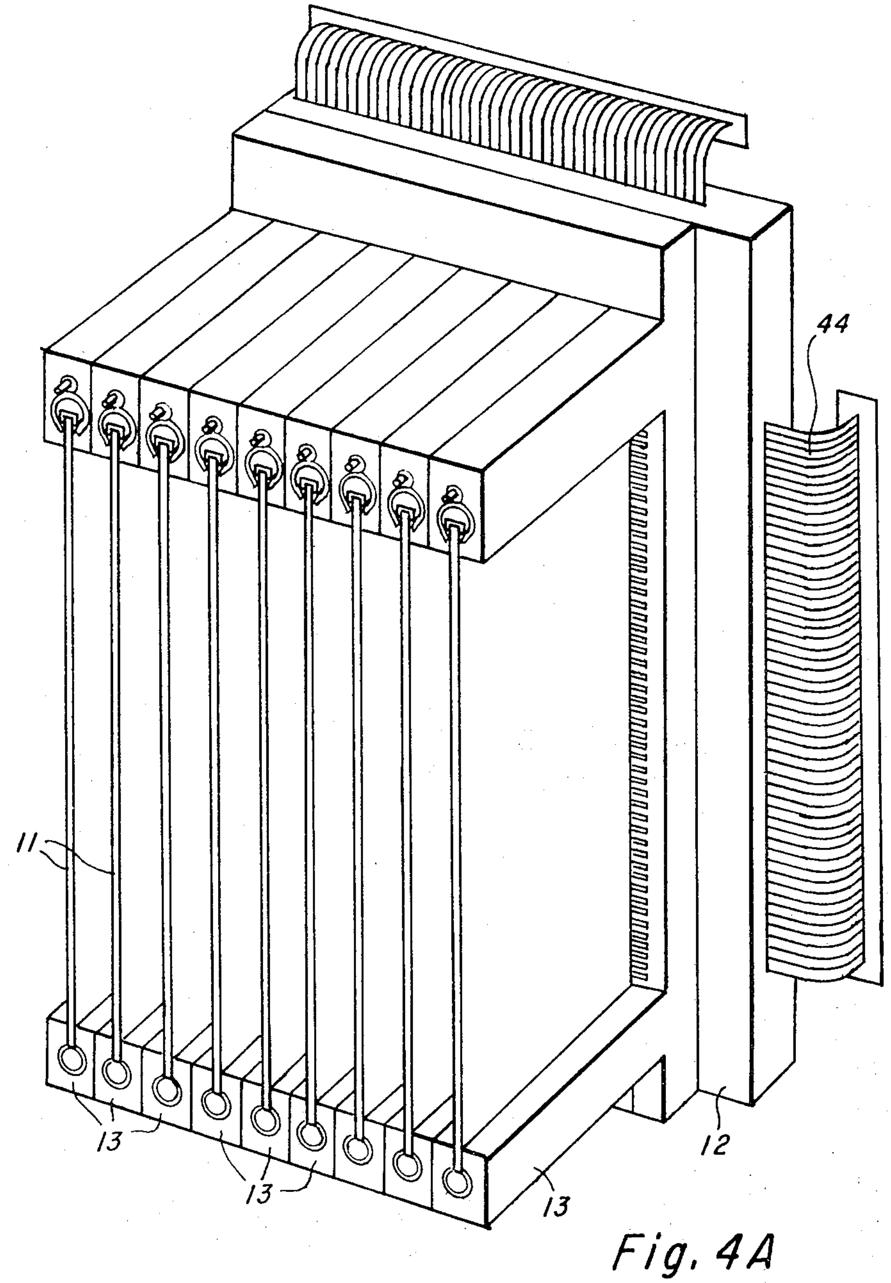
FIGS. 4A & 4B are isometric views of a multi-layer interconnection board on which a plurality of sockets are mounted for accepting the logic cards and the logic cards inserted in the sockets.

Referring to FIG. 4A, the logic cards 11 are stacked in high density on multi-layer interconnection boards 12 which provide interconnections between the logic cards and provide the necessary operating voltages to the voltage-ground plane conductors 19 and 21 of the logic cards 11. The multi-layer interconnection board 12 is comprised of a rigid material, such as a ceramic material, to provide a back panel for the logic cards 11. The logic cards 11 plug into connector sockets 13 which allows the system to be modular and facilitates in the maintenance and fabrication of the system. Twenty-two of the connector sockets 13, for example, are provided on a single interconnection board 12. The space requirement for a single interconnection board having the twenty-two cards mounted thereon is approximately 1/10 cubic foot. Because of the high density of integrated circuits per logic card 11 and the high density of logic cards on the interconnection board 12, an interconnection board having twenty-two cards would replace the logic circuits presently occupying approximately five cubic feet in advanced computer systems currently being manufactured. Accordingly, in accordance with the present invention, an advanced computer system having twenty-six cabinets one and one-half feet wide by two feet deep by six feet high can be replaced by six cabinets each one foot square by one and one-half feet high containing sixteen interconnection boards with twenty-two logic cards per board.

Each of the sockets 13 are approximately one-fourth inch wide. The multi-layer interconnection board for the twenty-two three and one-half inch cards would be approximately four inches by six and one-half inches. The interconnection boards 12 would include, for example, ten layers of interconnections sandwiched between the ceramic material, with two of the ten layers providing voltage planes and the remaining eight layers providing signal planes to interconnect the logic cards.

Strip line and micro-strip transmission lines are utilized to effect relatively long interconnections on the interconnection boards. Loading along these strip lines is limited to a single load at the end of the line. This allows the use of transmission lines, where required in special cases, with loose tolerances that are relatively easy and economical to fabricate. Materials such as teflon are used which exhibit a low relative dielectric constant to achieve the fastest propagation velocities and highest impedances.

Figure 4B:
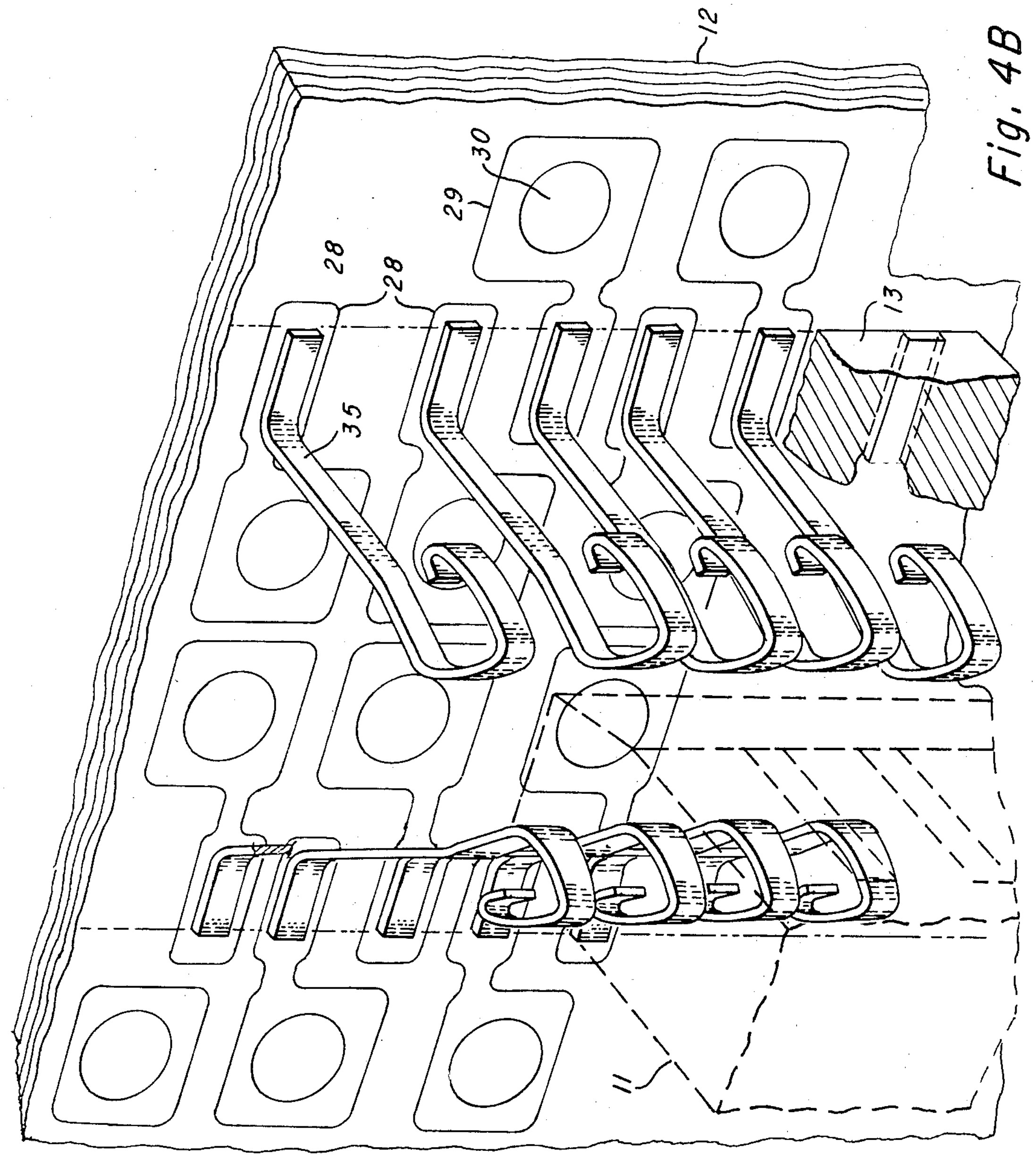

Referring to FIG. 4B, a major surface of the multilayer interconnection board 12 is shown upon which the sockets 13 are mounted. Conductors 28 are provided for connection to spring contacts 35 in the sockets 13. The conductors 28 have an expanded area 29 which connects the conductor to feedthrough conductors 30 establishing connection to interconnects of one of the signal layers of the multi-layer board 12.

In the embodiment illustrated in FIG. 4B, the contacts 35 of the sockets 13 are approximately 10 mils wide while the pads upon which they are bonded are 15 mils wide by 30 mils in length. The expanded portions 29 of the conductors 28 are approximately 35 mils square on 50 mil centers providing 15 mil spacing between conductors. The feedthrough conductors 30 are approximately ten mils in radius.

Figures 5A, 5B:
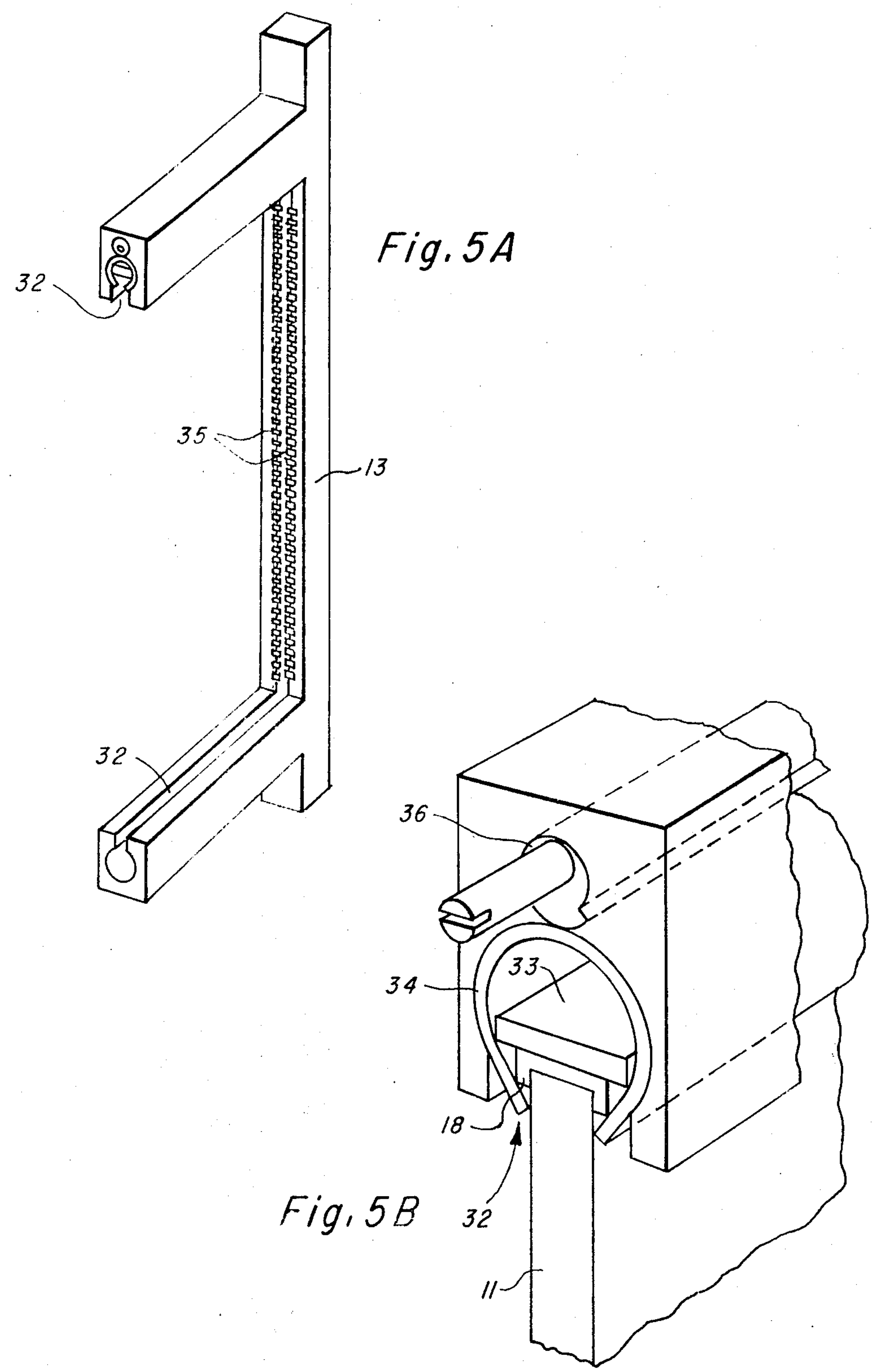
FIGS. 5A & 5B are isometric views of the sockets in which the logic cards are mounted.

The sockets 13 which accept the logic cards 11 and which are mounted on the interconnection boards 12 are shown in greater detail in FIGS. 5A and 5B. Referring then to FIG. 5A, a socket 13 is shown in which the logic cards 11 are removably mounted by sliding the cards into channels 32. The input/output edge connectors 22 of the logic cards 11 make electrical contact with the spring contacts 35 of the sockets 13.

Referring to FIG. 5B, the voltage and ground edge connectors 19 and 20, respectively, make electrical contact with a conductor 33 in the respective channels 32. The channels 32 also include a lock spring 34 which is increasingly flexed by the pressure applied in accordance with the position of cam 36. After the card 11 is inserted into the socket 13, the cam 36 is rotated to flex the spring 34 and lock the card in place. The cam 36 is rotated in the opposite direction to unflex the spring 34 when the card is to be removed for repair.

One or more of the sub-unit assemblys each including a plurality of the logic cards 11 inserted into the sockets 13 which are mounted on interconnection boards 12 are then packaged to provide the complex digital system. Where multiple sub-units are interconnected together within the same package, the interconnection boards 12 are electrically connected together by controlled impedance flexible connectors, for example. The sub-units are mounted in relatively close proximity in order to retain the nontransmission line integrity of the system. The flexible film connector 34 is shown in FIG. 4A.

Figure 6:
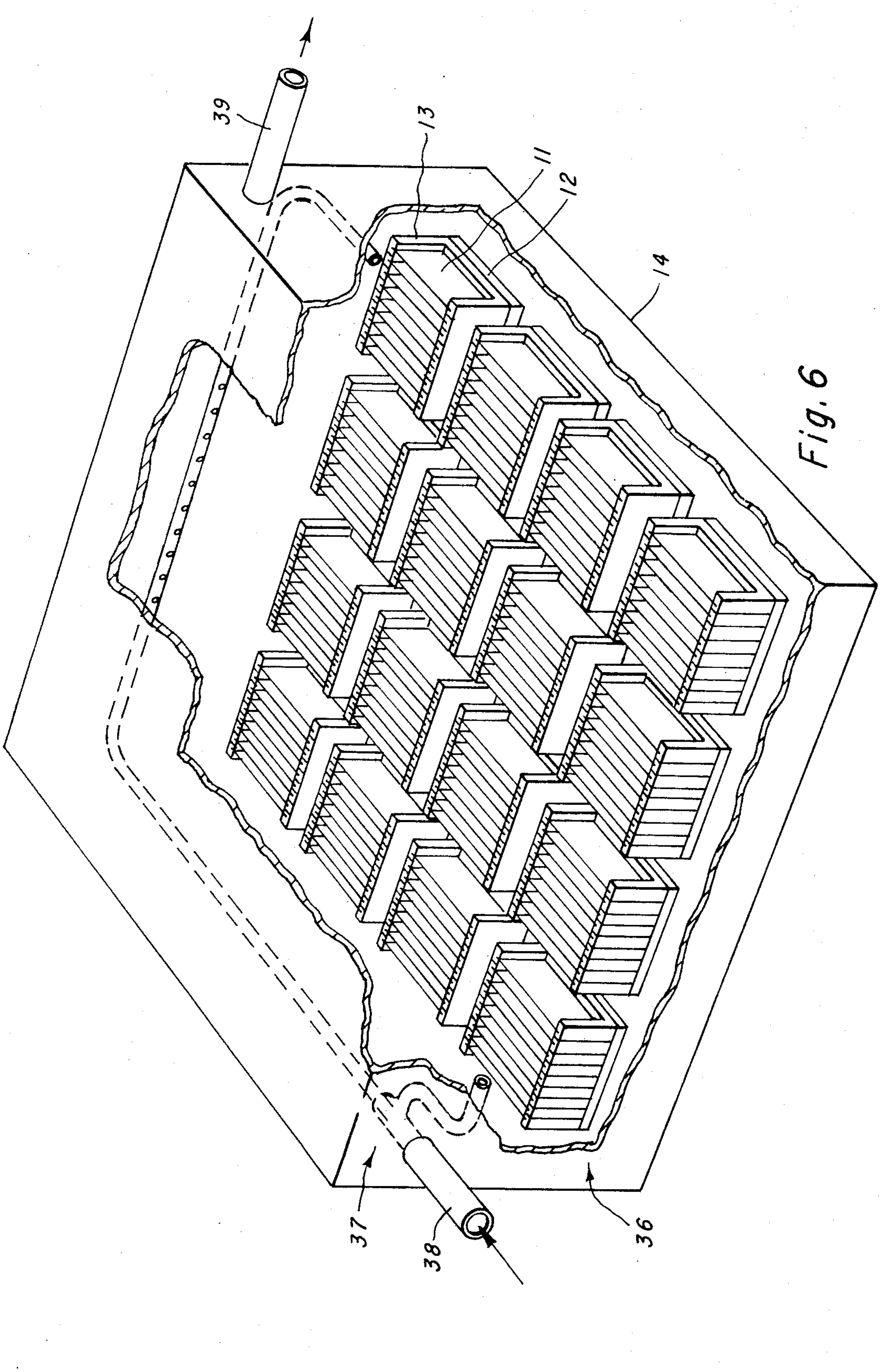
FIG. 6 is an isometric view of another embodiment of the high density digital system interconnected and packaged in accordance with the present invention showing in detail an embodiment of the cooling system utilized in the invention.

As previously mentioned, in order to provide the heat transfer necessary for the increased power density resulting from the increased density of semiconductor integrated circuits per unit volume, the sub-units are packaged in a liquid cooling system liquid convection and embullient boiling provides the necessary cooling which cannot be provided by conventional forced air convection cooling. The liquid cooling system package 14 includes, for example, a first liquid layer 36 of a florocarbon and a second liquid layer 37 such as water. The first liquid layer is, for example, an FC78 florocarbon commercially available from the 3-M Company which possesses very low dielectric constants, has relatively high heat capacity and boils at temperatures of from 25° C. to 50° C. The florocarbons do not affect the electrical operation of the unpackaged semiconductor integrated circuits and, due to the relatively low thermal resistance of silicon, the device junctions of each integrated circuit can be maintained at essentially the same temperature regardless of the power dissipated. The second liquid layer is contiguous with the first liquid layer and is utilized to exchange heat from the first liquid layer by means of intake 38 and outtake 39 to a heat exchanger external to the system package 14. Liquid cooling systems similar to the liquid cooling used in the embodiment of FIG. 6 are described in an article by S. Oktay entitled, "Multi-Fluid Subdued Boiling; A Theoretical Analysis of Multi-Fluid Subdued Boiling; A Theoretical Analysis of Multi-Fluid Interface Bubbles, " *IBM Journal of Research and Development*, *September*, 1971.

Several embodiments of the invention have now been described in detail. It is to be noted, however, that these descriptions of specific embodiments are merely illustrative of the principle underlying the inventive concept. It is contemplated that various modifications of the distinct embodiments, as well as other embodiments of the invention, will, without departing from the spirit and scope of the invention, be apparent to persons skilled in the art.

What is claimed is:

1. A high density interconnection and packaging arrangement for complex digital systems comprising in combination:

a. a plurality of logic cards each logic card including a multiplicity of unpackaged semiconductor integrated circuit chips mounted directly on a major surface thereof;

b. a multi-layer interconnection board having a plurality of interconnection layers for interconnecting said logic cards being mounted on said multi-layer interconnection board; and, c. a package including a liquid cooling system, said plurality of logic cards mounted on said multi-layer interconnection board being immersed in a liquid coolant within said package.

2. The interconnection and packaging arrangement according to claim 1 wherein said logic cards include interconnection patterns on at least said major surface for interconnecting said unpackaged semiconductor integrated circuit elements and beam leads connecting said unpackaged semiconductor integrated circuit elements to said interconnection patterns.

3. The interconnection and packaging arrangement according to claim 1 wherein the logic cards include interconnection patterns on at least said one major surface and said unpackaged semiconductor integrated circuit elements are solder bonded to said interconnection patterns.

4. The interconnection and packaging arrangement according to claim 1 wherein the logic cards include interconnection patterns on at least one major surface thereof for providing interconnections to said unpackaged semiconductor integrated circuit elements and said unpackaged semiconductor integrated circuit elements are connected to said interconnection patterns by means of intermediary interconnection patterns formed on flexible polyimide film.

5. The interconnection and packaging arrangement according to claim 1 including sockets mounted on said multi-layer interconnection boards, each of said sockets adapted to accept one of said logic cards and provide interconnections between said logic cards and said multi-layer interconnection board.

6. The interconnection and packaging arrangement according to claim 5 wherein said sockets include a plurality of spring contacts which make electrical contact with terminal contacts on said logic cards, said spring contacts being individually mounted directly to interconnection pads on said multi-layer interconnection boards.

7. The interconnection and packaging arrangement according to claim 5 wherein said logic cards include edge conductors, at least one such edge conductor being on either end of each of said logic cards for providing operating voltages to the unpackaged semiconductor integrated circuit elements mounted on the logic card, and wherein said sockets include corresponding channels on either end thereof including conductor strips which are adapted to make electrical contact with the edge conductors of said logic cards.

8. The interconnection and packaging arrangement according to claim 7 including a spring lock within the channels of said sockets, said spring lock being operable by a rotatable cam for locking said logic card into said socket and ensuring electrical contact between said edge conductors on said logic card and the conductors within said channels.

9. The interconnection and packaging arrangement according to claim 1 wherein said liquid coolant is a florocarbon.

10. The interconnection and packaging arrangement according to claim 1 wherein said liquid cooling system includes a plurality of liquids, a first liquid in which said logic cards and multi-layer interconnection board are immersed and a second liquid contiguous with said first liquid for exchanging heat from said first liquid through a heat exchanger.

11. The interconnection and packaging arrangement according to claim 1 wherein the logic cards include at least three levels of interconnections, a first level providing interconnections mainly in the $x$ direction, a second level providing interconnections mainly in the $y$ direction and a third level providing the necessary operating voltages for the semiconductor integrated circuits.

12. The interconnection and packaging arrangement according to claim 11 including feedthrough conductors in said logic cards coupling interconnections in said first level with interconnections in said second level.

13. A high density interconnection and packaging arrangement for complex digital systems comprising in combination:

a. a plurality of logic cards, each including
   i. a multiplicity of closely spaced unpackaged semiconductor integrated circuit chips mounted directly thereon, and
   ii. at least one level of interconnections interconnecting the integrated circuit chips on said logic cards, the spacing between said semiconductor integrated chips being sufficiently small that the interconnections between said integrated circuit chips are essentially nontransmission lines;

b. a multi-layer interconnection board upon which said plurality of logic cards are mounted in close proximity, the multi-layer interconnection board having a plurality of levels of interconnections and providing the interconnections between said logic cards with the spacing between said logic cards being sufficiently small that the interconnections between said logic cards are essentially nontransmission lines; and, c. a package including a liquid cooling system having a liquid coolant in which the logic cards mounted on the interconnection board are immersed.

14. The interconnection and packaging arrangement according to claim 13 wherein said logic cards include interconnection patterns on at least said major surface for interconnecting said unpackaged semiconductor integrated circuit elements and beam leads connecting said unpackaged semiconductor integrated circuit elements to said interconnection patterns.

15. The interconnection and packaging arrangement according to claim 13 including sockets mounted on said multilayer interconnection boards, each of said sockets adapted to accept one of said logic cards and provide interconnections between said logic cards and said multi-layer interconnection board.

16. The interconnection and packaging arrangement according to claim 13 wherein said sockets include a plurality of spring contacts which make electrical contact with terminal contacts on said logic cards, said spring contacts being individually mounted directly to interconnection pads on said multi-layer interconnection boards.

17. The interconnection and packaging arrangement according to claim 13 wherein said logic cards include edge conductors, at least one such edge conductor being on either end of each of said logic cards for providing operating voltages to the unpackaged semiconductor integrated circuit elements mounted on the logic card, and wherein said sockets include corresponding channels on either end thereof including conductor strips which are adapted to make electrical contact with the edge conductors of said logic cards.

18. The interconnection and packaging arrangement according to claim 13 wherein said liquid coolant is a florocarbon.

19. The interconnection and packaging arrangement according to claim 13 wherein said liquid cooling system includes a plurality of liquids, a first liquid in which said logic cards and multi-layer interconnection board are immersed and a second liquid contiguous with said first liquid for exchanging heat from said first liquid through a heat exchanger.

20. The interconnection and packaging arrangement according to claim 13 wherein the logic cards include at least three levels of interconnections, a first level providing interconnections mainly in the $x$ direction, a second level providing interconnections mainly in the $y$ direction and a third level providing the necessary operating voltages for the semiconductor integrated circuits.

21. A method of fabricating a high density complex digital system comprising the steps of:

a. Mounting a multiplicity of unpackaged semiconductor integrated circuit chips on a major surface of a plurality of logic cards;

b. mounting said plurality of said logic cards on one or more multi-layer interconnection boards having a plurality of interconnection layers for interconnecting said logic cards; and c. packaging said one or more of said multi-layer interconnection boards including said logic cards in a liquid cooling system, said interconnection boards and logic cards being immersed in a liquid coolant within the package, said chips being exposed in said liquid.

22. The method according to claim 21 including mounting said plurality of said logic cards on said one or more multi-layer interconnection boards with sockets adapted therefore by mounting individual spring contacts directly to contacts on said interconnection board, mounting said socket over said spring contacts and inserting said logic cards in said sockets to make electrical contact between said spring contacts and interconnection terminals on said logic cards.

23. An interconnection arrangement for mounting a plurality of logic cards comprising:

a. (A) a plurality of logic cards, each logic card including a plurality of circuit elements mounted on a major surface thereof, a plurality of interconnection terminal contacts on said major surface extending to a first edge thereof opposite a second edge one or more voltage planes, and a plurality of edge conductors providing contact to said one or more voltage planes (on said logic cards), at least one such edge conductor being on third and fourth opposite edges of said logic cards, and essentially extending along the entire respective edge; and b. a plurality of sockets (adapted to accept) accepting said logic cards, said sockets including a plurality of spring contacts removably connected to said edge conductors and a plurality of channels including conductor strips within (with) said channels which (are adapted to) conductor strips make electrical contact with the edge conductors of said logic cards.

24. The interconnection arrangement according to claim 23 wherein said sockets are mounted on a multilayer interconnection board.

25. The interconnection arrangement according to claim 24 wherein said spring contacts are individually mounted directly to interconnection pads on said multi-layer interconnection boards and the portion of said sockets including said channels is mounted over said spring contacts and extends therethrough to make contact with said terminal contacts to logic cards inserted in said channels.

* * * * *

UNITED STATES PATENT OFFICE
CERTIFICATE OF CORRECTION

Patent No. 3,812,402 Dated May 21, 1974

Inventor(s) Emory C. Garth

It is certified that error appears in the above-identified patent and that said Letters Patent are hereby corrected as shown below:

23. An interconnection arrangement for mounting a plurality of logic cards comprising:

(a) a plurality of logic cards, each logic card including a plurality of circuit elements mounted on a major surface thereof, a plurality of interconnection terminal contacts on said major surface extending to a first edge thereof opposite a second edge, one or more voltage planes, and a plurality of edge conductors providing contact to said one or more voltage planes, at least one such edge conductor being on third and fourth opposite edges of said logic cards, and essentially extending along the entire respective edge; and (b) a plurality of sockets accepting said logic cards, said sockets including a plurality of spring contacts removably connected to said edge conductors and a plurality of channels including conductor strips within said channels which conductor strips make electrical contact with the edge conductors of said logic cards.

Signed and sealed this 12th day of November 1974.

(SEAL)
Attest:

McCOY M. GIBSON JR.
Attesting Officer

C. MARSHALL DANN
Commissioner of Patents